United States Patent
Kroell

(10) Patent No.: US 10,234,526 B2
(45) Date of Patent: Mar. 19, 2019

(54) AUTOMATIC CREATION OF MR SCAN TEMPLATES FOR A MAGNETIC RESONANCE APPARATUS

(71) Applicant: Siemens Healthcare GmbH, Erlangen (DE)

(72) Inventor: Maria Kroell, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 132 days.

(21) Appl. No.: 15/499,309

(22) Filed: Apr. 27, 2017

(65) Prior Publication Data

US 2017/0315196 A1    Nov. 2, 2017

(30) Foreign Application Priority Data

Apr. 27, 2016  (DE) .................. 10 2016 207 118

(51) Int. Cl.
*G01V 3/00*     (2006.01)
*G01R 33/54*    (2006.01)
*G01R 33/483*   (2006.01)
*G01R 33/56*    (2006.01)

(52) U.S. Cl.
CPC ......... *G01R 33/543* (2013.01); *G01R 33/483* (2013.01); *G01R 33/5608* (2013.01)

(58) Field of Classification Search
USPC ....................................................... 324/309
See application file for complete search history.

(56) References Cited

U.S. PATENT DOCUMENTS

| | | | |
|---|---|---|---|
| 6,493,571 B1* | 12/2002 | Bis .................. | A61B 5/0555 324/307 |
| 6,636,038 B1 | 10/2003 | Heid | |
| 2005/0165294 A1* | 7/2005 | Weiss ................ | A61B 6/032 600/410 |
| 2010/0284595 A1* | 11/2010 | Mori ................. | G01R 33/56 382/131 |
| 2012/0093384 A1* | 4/2012 | Goto ................ | G01R 33/543 382/131 |
| 2015/0182117 A1* | 7/2015 | Senegas ............ | A61B 5/055 600/410 |
| 2015/0241537 A1* | 8/2015 | Dannels ........... | G01R 33/56554 324/309 |
| 2016/0349341 A1* | 12/2016 | Cohen ............... | A61B 5/055 |
| 2018/0238983 A1* | 8/2018 | Cohen ............... | G01R 33/543 |

* cited by examiner

*Primary Examiner* — Rodney E Fuller
(74) *Attorney, Agent, or Firm* — Schiff Hardin LLP

(57) ABSTRACT

In a magnetic resonance (MR) apparatus and operating method, an MR scan is designated in a processor by acquiring values of parameters of imaging sequences of the MR scan. The MR scan and properties of the MR scan are stored so as to be allocated to an MR scan template. The acquisition of an MR scan and the storing of an MR scan template are carried out several times. In the processor, one of the MR scan templates is determined by detecting properties of an MR scan to be performed and determining the MR scan template as a function of the properties. Imaging sequences of the determined MR scan template are then implemented in order to acquire MR data.

9 Claims, 2 Drawing Sheets

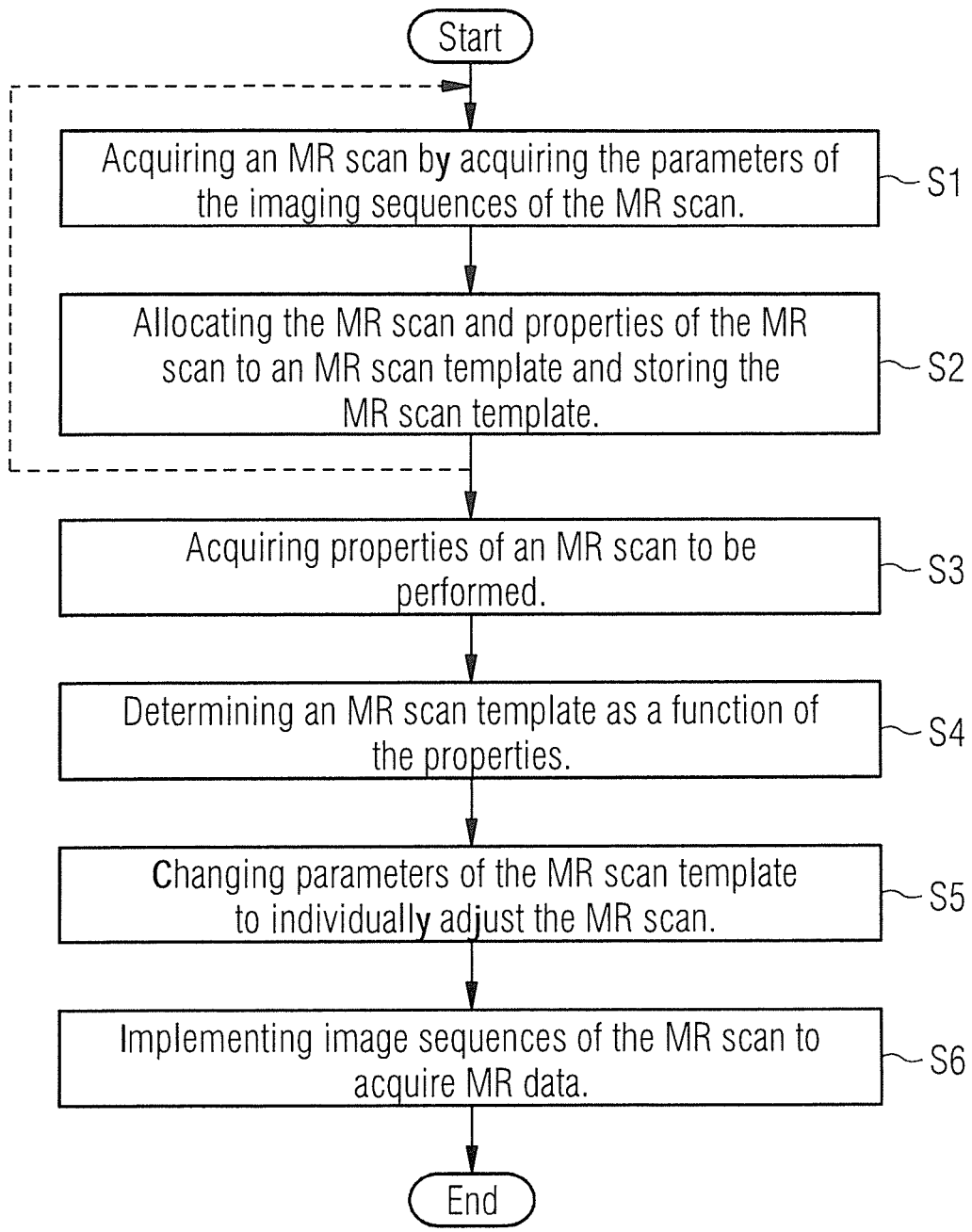

AUTOMATIC CREATION OF MR SCAN TEMPLATES FOR A MAGNETIC RESONANCE APPARATUS

BACKGROUND OF THE INVENTION

Field of the Invention

The present invention relates to the automatic creation of MR scan templates for a magnetic resonance apparatus, with which a user can carry out an MR scan in a standardized manner on the magnetic resonance apparatus.

Description of the Prior Art

According to the prior art, magnetic resonance apparatuses are known in which MR scan templates can be created or defined, for example by an administrator. Starting from a determined strategy (e.g. examination of an upper body, with the patient having to hold his or her breath), particular patient properties (e.g. height and weight) and further requirements or properties of an MR scan to be performed, a user of the magnetic resonance apparatus can then choose or determine an appropriate MR scan template, so the user receives the MR scan allocated to this MR scan template, which has the desired properties. This MR scan can then be performed by the magnetic resonance apparatus to acquire MR data. Performance of an MR scan of this kind, starting from an MR scan template, is also very straightforward for the inexperienced user of a magnetic resonance apparatus. However, creation of a (new) MR scan template according to the prior art is very complex for the administrator since he or she has to consider a large number of parameters, conditions and dependencies without being able to check their effectiveness.

Therefore, according to the prior art, it is often the case that the MR scan templates pre-configured by the manufacturer are not used at all in daily operation since, in detail, they do not meet the individual needs of the user, and as a result of the complexity associated therewith, there is no adjustment thereto, or perhaps an adjustment is not even possible. New MR scan templates are not created at all in this context, or at most with the assistance of manufacturer's experts. In other words, the MR scan templates according to the prior art, which are very helpful per se, are frequently used only rudimentarily since the specific adjustments to the particular circumstances are regarded as being too complex.

SUMMARY OF THE INVENTION

An object of the present invention is to simplify creation of MR scan templates for a magnetic resonance apparatus.

Within the scope of the present invention a method for acquiring MR data of an examination object (a living patient) using a magnetic resonance apparatus is provided, that has the following steps.

An MR scan is acquired, which is created by a user of the magnetic resonance apparatus in order to acquire MR data of the examination object using the MR scan. The MR scan is acquired by detecting values of parameters of one or more imaging sequences of the MR scan and storing them. This step is carried out, for example, if a user configures an MR scan (scan program) on the magnetic resonance apparatus, wherein the user sets or configures individual parameters of the imaging sequences of this MR scan, for example using parameter maps, to then carry out the imaging sequences by operation of the magnetic resonance apparatus (or the scanner thereof). This step also includes automatic acquisition of properties of the MR scan by the magnetic resonance apparatus. These properties usually include the strategy with which the MR data are acquired with the created MR scan, patient properties, and the body region of the patient, from which the MR data are acquired. This step can also include a simulation of the acquired MR scan in order to be able to control the quality of the MR scan before the MR scan is actually performed with the magnetic resonance apparatus. With a negative result of the simulation, the MR scan can be discarded or the MR scan is changed so this step of acquiring an MR scan is virtually performed again (for the changed MR scan).

A (new) scan template is stored by associating the previously acquired MR scan and particular properties of the MR scan, which are likewise automatically detected by the magnetic resonance apparatus (or the scanner thereof), to the MR scan template and storing them. In other words, the MR scan previously set for the magnetic resonance apparatus forms the basis for the automatic creation of the (new) MR scan template by the magnetic resonance apparatus. A new MR scan template is therefore newly (automatically) created on the basis of existing parameters, such as the acquired body region. The previously described step of acquiring an MR scan and the step of storing the MR scan template described here are carried out several times, so a number of MR scan templates exists after carrying out these steps.

One of the previously created MR scan templates is determined in a processor that is provided with designations (inputs) of properties of an MR scan to be performed by the magnetic resonance apparatus, and the corresponding MR scan template is determined by the processor as a function of these properties. Using particular properties or information about the MR scan to be formed, in this step the processor of the magnetic resonance apparatus determines the allocated MR scan template, and therewith the MR scan allocated to this MR scan template, and ultimately the parameters of the image sequences of this MR scan.

In a last step, the magnetic resonance apparatus carries out the imaging sequences of the MR scan determined using the previously determined MR scan template, in order to acquire the MR data of the examination object. The acquired MR data are made available from the processor as a data file.

MR scan templates can be created very easily by the inventive method. To create a new MR scan template, the administrator advantageously remains in the world with which he or she is familiar, and creates a scan program or an MR scan in the usual manner by adjusting the individual parameters, e.g. in the parameter maps. From the scan program or MR scan created in this way, an MR scan template is then automatically created using the inventive method.

While creation of the MR scan, which is acquired in the step of acquiring an MR scan, is implemented with a first tool (e.g. based on parameter maps) of the magnetic resonance apparatus, manual direct creation or manual change to an MR scan template is implemented with a second tool of the magnetic resonance apparatus. Handling of the first tool, usually by almost daily use, is perceived to be very straightforward, while handling of the second tool, which is used only very rarely by the average user, is complicated. Because MR scan templates are automatically created by the magnetic resonance apparatus in accordance with the invention starting from an MR scan, an MR scan template can also be effected without the use of the second tool by the use of the present invention.

As used herein, a parameter map means the provision of particular or all parameters of the imaging sequences of the MR scan. One possible value range can be given for each parameter. With the use of the parameter map, even the inexperienced user can correctly configure the parameters for one or more image sequences of the MR scan.

The parameters of an imaging sequence mean, inter alia, any of the flip angle, the repetition time (TR), the number of slices to be acquired, the slice thickness, slew rate of gradient moments, the dimensions of the field of view to be acquired.

One type of further parameter of an MR scan presents a decision. Such a decision is made on the basis of MR data acquired with the MR scan. An example of such a decision is whether a lesion is seen in MR images that are created on the basis of MR data acquired in a first part of the MR scan. If this is the case, further MR data are acquired in a second part of the MR scan, but otherwise not. A further example of such a decision is whether a lesion is classified as a hemorrhage or as a tumor in the MR images of the first part of the MR scan. Depending on the answer, the second part, or a different second part, of the MR scan is then implemented. The MR scan, which is acquired in the step of acquiring an MR scan and follows the basis of a new MR scan template, can be created using the following variants. The MR scan can itself be created starting from a previously created MR scan template and then, for example, be individually adjusted. The MR scan can be created without MR scan template, for example by the use of a parameter map.

As already described, the MR scan is created by a user in order to acquire MR data of the examination object with the aid of the MR scan with the magnetic resonance apparatus. Usually, the creation of an MR scan template is not intended by the user but is automatically carried out by the magnetic resonance apparatus.

The properties of an MR scan, which are allocated to the corresponding MR scan template and stored, can be one of more of the following items of information, with the parameters of the imaging sequence being adjusted to these properties or items of information of the MR scan.

One such item of information can be a strategy, with which the MR data of the examination object is to be acquired. One example of a strategy is acquiring the MR data while the patient holds their breath or does not move. Depending on the ability of the patient to hold their breath for a long or only a short time or to not move for only a short time, a fast variant or a standard variant of the corresponding strategy can be carried out. In other words, the corresponding imaging sequence acquires the MR data of the examination object in a correspondingly short time frame (with the fast variant) or longer time frame (with the standard variant). A further example of a strategy is the requirement for whether a lesion is to be detected using the acquired MR data or not or whether the MR scan should be sensitive or insensitive to movement.

Another such item of information can be a property of the examination object. Properties of the examination object can include the weight, the physical size, the age and the gender.

Another such item of information can be information about a body region of the examination object, from which the MR data is acquired with the MR scan. Examples of body regions are the head, upper body, a shoulder, an arm, a leg, foot or hand. Parameters of the MR scan are then set as a function of the body region.

Because, in accordance with the invention, the properties of the MR scan are allocated to the corresponding MR scan template and stored, the corresponding MR scan template and therewith the corresponding MR scan can advantageously also be determined using previously specified properties, so the magnetic resonance apparatus purposefully chooses the correct MR scan to acquire the MR data with the imaging sequences of this MR scan.

When storing the MR scan template, the MR scan template can also be allocated to an MR scan template category. MR scan templates that are similar to each other, for example, MR data of the same body region should be acquired or identical strategies pursued) are allocated to the same MR scan template category. If the magnetic resonance apparatus recognizes that a newly created and MR scan template that is to be stored cannot be allocated to an existing MR scan template category in accordance with particular allocation rules, then the magnetic resonance apparatus will create a new MR scan template category and allocate the MR scan template to be stored to this newly created MR scan template category.

By introducing MR scan template categories, the stored MR scan templates can be better organized, so the step of determining one of the MR scan templates using the properties of the MR scan to be performed is facilitated for the user.

For example, it is possible for the magnetic resonance apparatus to automatically detect the body region from which MR data are to be acquired with the acquired MR scan or with the MR scan template to be stored. In this case the MR scan template can be allocated to the MR scan template category as a function of the acquired body region.

For example, MR scan template categories can exist for particular body regions (e.g. head, shoulder). As the body region, for which the MR scan template to be stored (or, more precisely, the image sequences of the MR scan of the MR scan template) is intended, is automatically detected, the MR scan template to be stored can be allocated to the MR scan template category allocated to the particular body region. As a result, it is possible, for example, for all MR scan templates, which contain MR scans with which the head of the examination object is imaged, to be allocated to the head MR scan template category.

According to the invention it is also possible, when using an MR scan template, for parameters of the imaging sequences of the associated MR scan to be changed (for example by a user with administrator rights). These changes can occur in the same way as the parameters of a conventional imaging sequence (i.e., for example using parameter maps). There then exists the possibility that the changed MR scan template is stored as a new MR scan template. However, it is also possible that the previously determined MR scan template (i.e. the MR scan template, starting from which the MR scan, which was then changed, is provided to the user) is itself stored in a changed manner. In other words, there exists, for a user with administrator rights, either the possibility that the changes overwrite the former settings of the MR scan template or that a new alternative (in the form of a new MR scan template) is generated.

Changes to the parameters of the imaging sequences of the determined MR scan template, which were made, for example, by users without administrator rights, can likewise be detected by the inventive magnetic resonance apparatus. These changes can then be stored as a type of additional information, without the corresponding MR scan template (initially) being changed or a new MR scan template being created.

If, for example, a user with administrator rights works with the magnetic resonance apparatus, then these accumulated changes can be examined by the magnetic resonance apparatus to detect similar changes in the same MR scan template. If similar changes are actually detected on the same MR scan template, the magnetic resonance apparatus (optionally after appropriate confirmation by an administrator) can actually make these similar changes on the determined MR scan template. The correspondingly changed MR scan template can then either be stored as a new MR scan template, or instead of the original MR scan template.

With this embodiment, for example changes to settings, which are made by users without administrator rights, can subsequently be made available to an administrator cumulatively. The administrator is consequently given an impression of whether a corresponding adjustment or change is always made in the case of particular parameters. The administrator can then potentially adopt this change for the corresponding MR scan template or store it as an appropriate alternative, as is described above. In other words, logging or storing the changed settings of the MR scan creates a type of feedback loop, enabling a further improvement in the MR scan templates.

In this way the inventively created MR scan templates can be configured and automatically adjusted, without an administrator having to directly change an MR scan template in a complex manner with appropriate tools.

In other words, the magnetic resonance apparatus detects and analyzes the use of the of the MR scan templates during daily operation. Based on this usage analysis, adjustments can be made to the respective MR scan template (automatically or under the control of an administrator). If, for example, particular parameters are present, which are frequently adjusted, but always with different values, then these can be generated as parameters to be set for the respective MR scan template and therewith for the respective MR scan. These parameters can then be represented, for example as parameters to be set, on the parameter map (which shows only the most important parameters).

Other parameters whose values are usually changed to a different value compared to the value predefined by the MR scan template, can be adjusted accordingly in the respective MR scan template. In such an adjustment, a statistically significant more frequent value than a new value (of the respective parameter) is adopted in the MR scan template. In this way changes in the usage preference can also be mapped without an administrator having to actively intervene. If, for example, the standards of a hospital change for a particular MR scan (e.g. the scan duration has to be reduced from 5 to 4 minutes, something which is reflected in the change in corresponding parameters), then after a certain period of use the new parameters are inventively automatically adjusted in the associated MR scan template.

Based on permanent monitoring of use, the MR scan templates are advantageously also automatically adjusted to changed usage paradigms. This adjustment can technically be made with the use of artificial, neural networks ("Deep Learning" methods), resulting in an improvement in relation to usage frequency. As a result, parameters, which are frequently changed (and can thereby be rated as important), are accordingly quickly adjusted in the respective MR scan template.

A magnetic resonance apparatus for acquiring MR data of an examination object is also provided within the scope of the present invention. The magnetic resonance apparatus has an MR data acquisition scanner that has a basic field magnet, a gradient field system, at least one RF antenna and a controller for controlling the gradient field system and the at least one RF antenna and for receiving the MR data recorded by at least one RF antenna. The magnetic resonance apparatus is designed so that the magnetic resonance apparatus acquires an MR scan several times by acquiring values of parameters of imaging sequences of the MR scan and storing one MR scan template in each case, by acquiring the MR scan and properties of the MR scan which go beyond the imaging sequences, and in each case allocating the MR scan and the properties of the MR scan to an MR scan template (or creating the template and then allocating), and storing this MR scan template together with the MR scan and properties allocated thereto.

The advantages of the inventive magnetic resonance apparatus correspond to the advantages of the inventive method that have been described above in detail.

The present invention also encompasses a non-transitory, computer-readable data storage medium that is encoded with programming instructions (program code) that, when the storage medium is loaded into a memory of a programmable controller or an arithmetic unit of a magnetic resonance apparatus, cause all or various previously described embodiments of the inventive method to be implemented as the program code is executed in the controller. The program code may require libraries and auxiliary functions and the like in order to implement the corresponding embodiments of the method. The code can be a source code (e.g. C++), which still has to be compiled (translated) and linked or which only has to be interpreted, or an executable software code that merely has to be loaded into the appropriate arithmetic unit or controller for execution.

The electronically readable data carrier can be, for example, a DVD, magnetic tape, a hard disk or a USB stick, on which electronically readable control information is stored.

The present invention combines the straightforward creation or change in MR scan with the creation of MR scan templates. Advantageously it is no longer imperative for the creation or configuration of an MR scan template for a complex configuration interface to be operated. Instead, MR scan templates can be created and configured more or less implicitly by the daily creation of MR scans which can then be stored by the magnetic resonance apparatus in the form of MR scan templates.

An administrator is provided, moreover, with numerous examples of MR scan templates by the automatic creation of MR scan templates. Using these examples the administrator can then easily create his own MR scan templates with the tools known from the prior art.

BRIEF DESCRIPTION OF THE DRAWINGS

FIG. 2 is a flowchart of an inventive method.

DESCRIPTION OF THE PREFERRED EMBODIMENTS

Figure 1:
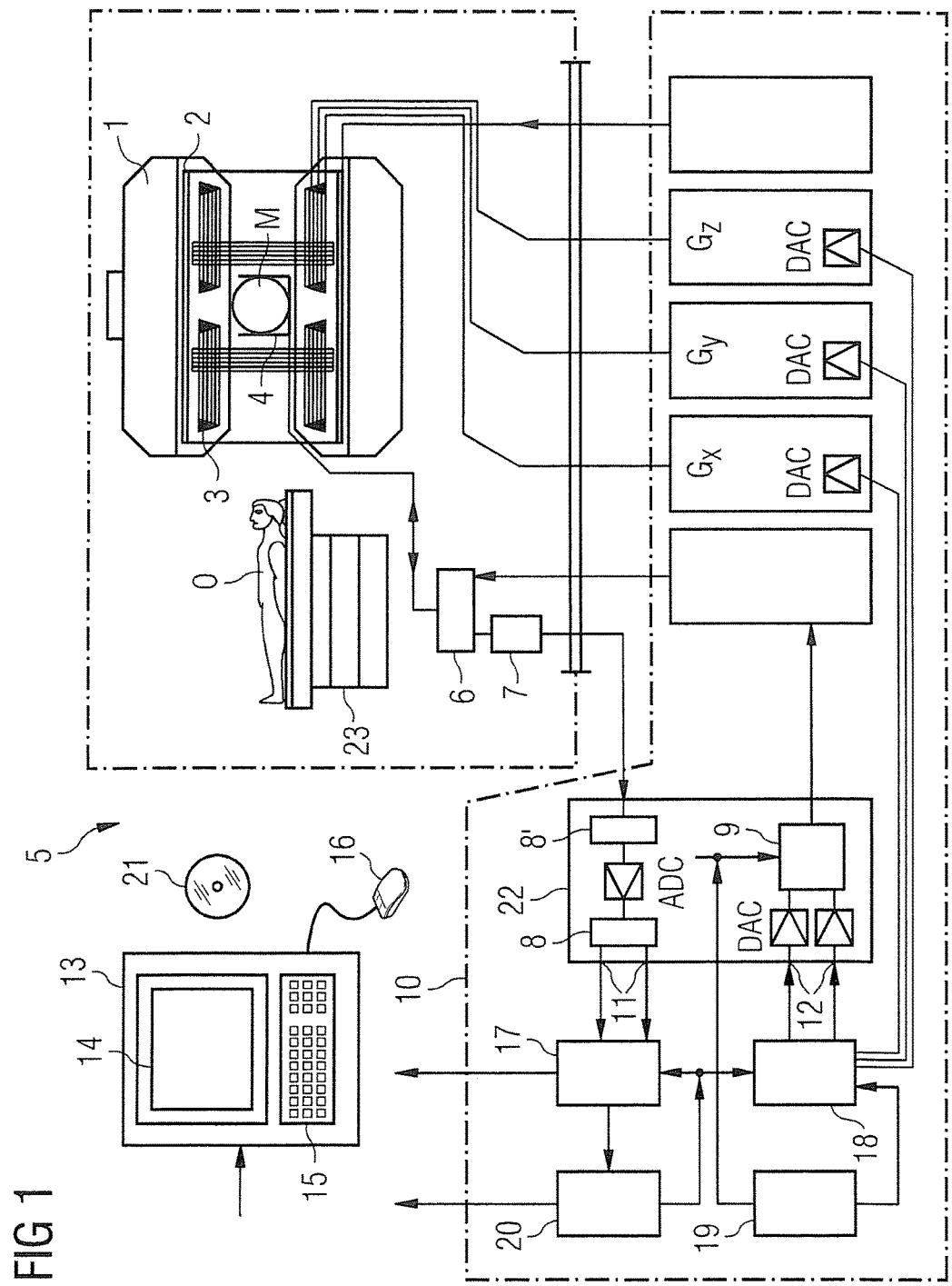
FIG. 1 schematically shows an inventive magnetic resonance apparatus.

FIG. 1 is a block diagram of an inventive magnetic resonance apparatus 5 (a magnetic resonance imaging or tomography apparatus). A basic field magnet 1 of an MR scanner generates a strong magnetic field that is constant over time, for polarization or orientation of nuclear spins in an examination region of an object O, such as of a part of a human body to be examined, who is examined lying on a table 23 in the basic field magnet 1. The high homogeneity of the basic magnetic field required for the magnetic resonance scan is defined in a typically spherical scan volume M, in which the volume section of the human body to be examined is situated. In order to maintain the homogeneity requirements and in particular to eliminate influences that are invariable over time, shim plates made of ferromagnetic material are provided at suitable points. Influences that are variable over time are eliminated by shim coils 2 operated by a shim coils supply (amplifier).

A cylindrical gradient field system or gradient field system 3, composed of three sub-windings, is built into the scanner. Each sub-winding is supplied with current by an amplifier so as to generate a linear gradient field (also changeable over time) in a respective direction of a Cartesian coordinate system. The first sub-winding of the gradient field system 3 generates a gradient $G_x$ in the x-direction, the second sub-winding generates a gradient $G_y$ in the y-direction and the third sub-winding generates a gradient $G_z$ in the z-direction. Each amplifier has a digital-to-analogue converter that is controlled by a sequence controller 18 for correctly-timed generation of gradient pulses.

Within the gradient field system 3 there is one (or more) radio-frequency antenna(e) 4, which convert(s) radio-frequency pulses emitted by a radio-frequency power amplifier into a magnetic alternating field for excitation of the nuclei and orientation of the nuclear spins of the object O to be examined or of the region to be examined of the object O. Each radio-frequency antenna 4 has one or more RF transmitting coil(s) and one or more RF receiving coil(s) in the form of an annular, preferably linear or matrix-like assembly of component coils. The alternating field issuing from the precessing nuclear spins, usually the nuclear spin echo signals caused by a pulse sequence from one or more radio-frequency pulse(s) and one or more gradient pulse(s), is also converted by the RF receiving coils of the respective radio-frequency antenna 4 into a voltage (measuring signal), which is fed via an amplifier 7 to a radio-frequency receiving channel 8 of a radio-frequency system 22. The radio-frequency system 22, which is part of a controller 10 of the magnetic resonance apparatus 5, also has a transmitting channel 9 in which the radio-frequency pulses are generated for the excitation of the magnetic nuclear resonance. The respective radio-frequency pulses are represented digitally as a sequence of complex numbers by a pulse sequence in the sequence controller 18, predefined by a system computer 20. This numerical sequence is fed as real and imaginary parts respectively via inputs 12 to a digital-to-analog converter in the radio-frequency system 22, and from this to a transmitting channel 9. In the transmitting channel 9, the pulses sequences are modulated to a radio-frequency carrier signal whose base frequency matches the resonance frequency of the nuclear spins in the scanning volume.

The changeover from transmitting to receiving mode is made by a duplexer 6. The RF transmitting coils of the radio-frequency antenna(e) 4 radiate the radio-frequency pulses in order to induce the nuclear spins in the scanning volume M, and resulting echo signals are sampled (detected) by the RF receiving coil(s). The correspondingly obtained nuclear resonance signals are phase-sensitively demodulated in the receiving channel 8' (first demodulator) of the radio-frequency system 22 to an intermediate frequency, digitized in the analog-to-digital converter (ADC), and emitted via the output 11. This signal is demodulated to the frequency 0. The demodulation to frequency 0 and the separation into real and imaginary parts takes place in a second demodulator 8 after digitization in the digital domain. An MR image is reconstructed by an image processor 17 from the scan data obtained in this way, provided at an output 11. The scan data, image data and the control programs are administered by the system computer 20. As a result of a specification with control programs, the sequence controller 18 controls the generation of the desired pulse sequences and the corresponding sampling of k-space. In particular, the sequence controller 18 controls the correctly-timed switching of the gradients, emission of the radio-frequency pulses with defined phase amplitude and receiving of the nuclear resonance signals. The time base for the radio-frequency system 22 and the sequence controller 18 is supplied by a synthesizer 19. The choice of appropriate control programs for generating an MR image, which are stored e.g. on a DVD 21, and the representation of the generated MR image is made via a terminal 13 that has a keyboard 15, a mouse 16 and a screen 14. The steps of acquiring the MR scan, of storing the MR scan template and of determining the MR scan template are carried out in this terminal 13.

FIG. 2 shows the flowchart of an inventive process.

In step S1 the parameters of the imaging sequences of an MR scan are acquired and, as a result, the MR scan itself is acquired by the magnetic resonance apparatus 5. In addition, particular properties of the MR scan (e.g. with which strategy the MR data is acquired, properties of the examination object, from which body region the MR data is acquired) can also be acquired by the magnetic resonance apparatus in this step. In the following step S2 the MR scan (i.e. essentially the parameters of the imaging sequences) and the properties of the MR scan are allocated to an MR scan template and the MR scan template stored therewith. Steps S1 and S2 are performed several times, so a number of MR scan templates is stored or present before implementation of step S3. It is also possible for MR scan templates to be created in some other way (e.g. with specific tools for direct creation of an MR scan template) and are therefore available for selection in the following step S3.

In step S3 properties for a new MR scan to be performed are acquired by the magnetic resonance apparatus, with these properties, as a rule, being specified by a user of the magnetic resonance apparatus. Depending on these properties, one of the previously created and stored MR scan templates is determined in the following step S4, so the MR scan (and therewith the parameters of the imaging sequences) of the MR scan template are also determined. In optional step S5 these parameters can be changed to individually adjust the imaging sequences of the MR scan. Finally, in step S6 the imaging sequences of the MR scan are applied in order to acquire MR data with the operation of the scanner magnetic resonance apparatus 5.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus, comprising:

acquiring an MR scan in a processor by providing said processor with respective values of parameters of imaging sequences of the MR scan;

in a memory accessible by said processor, storing an MR scan template by storing the MR scan and properties of said MR scan, allocated to the MR scan template in said memory;

in said processor, repeating acquisition of said MR scan and storing of said MR scan template multiple times, thereby obtaining a plurality of scan templates in said memory;

in said processor, determining one of said MR scan templates in said memory by providing said processor with an input that designates properties of an MR scan to be performed and, in said processor, determining the MR scan template as a function of said properties; and from said processor, operating the MR apparatus to execute an imaging sequence according to the determined MR scan template in order to acquire MR data, and making the acquired MR data available from the processor as a data file.

2. A method as claimed in claim 1 comprising:
using, as said properties of said MR scan, at least one item of information to which the parameters of the imaging sequences are adjusted, said at least one item of information being selected from the group consisting of a strategy with which the MR data are to be acquired; and
a property of an examination subject from the MR data are to be acquired, and information describing a body region of an examination subject from which the MR data are to be acquired.

3. A method as claimed in claim 1 comprising:
storing the MR scan template by allocating the MR scan template to an MR scan template category in said memory;
allocating similar MR scan templates to a same MR scan template category; and
if an MR scan template produced among said repetitions cannot be allocated to an existing MR scan template category in said memory, creating a new MR scan template category.

4. A method as claimed in claim 3 comprising:
detecting a body region of a subject from which said MR data are to be acquired with said scan template to be stored; and
allocating the scan template to a scan template category dependent on said body region.

5. A method as claimed in claim 1 comprising:
detecting changes in parameters of said imaging sequences of the determined MR scan templates; and
storing an MR scan template in which parameters are changed as a new MR scan template or instead of a determined MR scan template.

6. A method as claimed in claim 1 comprising:
detecting changes in parameters of imaging sequences of the determined MR scan template; and
storing said changes as information in said memory without changing the determined MR scan template.

7. A method as claimed in claim 6 comprising:
evaluating said changes in order to detect similar changes among said changes;
implementing similar changes on the determined MR scan template; and
storing the changed MR scan template as a new MR scan template or instead of the determined MR scan template.

8. A magnetic resonance apparatus comprising:
an MR data acquisition scanner comprising a basic field magnet, a gradient field system, at least one RF antenna, and a controller configured to control the gradient field system and the at least one RF antenna in order to acquire MR data via said at least one RF antenna;
said controller being configured to acquire an MR scan by being provided with respective values of parameters of imaging sequences of the MR scan;
a memory accessible by said controller, said controller being configured to store an MR scan template by storing the MR scan and properties of said MR scan allocated to the MR scan template in said memory;
said controller being configured to repeat acquisition of said MR scan and storing of said MR scan template multiple times, thereby obtaining a plurality of scan templates in said memory;
said controller being configured to determine one of said MR scan templates in said memory by said controller being provided with an input that designates properties of an MR scan to be performed and, in said controller, determining the MR scan template as a function of said properties; and
said controller, operating the MR data acquisition scanner to execute an imaging sequence according to the determined MR scan template in order to acquire MR data, and making the acquired MR data available from the processor as a data file.

9. A non-transitory, computer-readable data storage medium encoded with programming instructions, said storage medium being loaded into a controller of a magnetic resonance apparatus and said programming instructions causing said controller to:
acquire an MR scan by receiving respective values of parameters of imaging sequences of the MR scan;
in a memory accessible by said processor, store an MR scan template by storing the MR scan and properties of said MR scan allocated to the MR scan template;
repeat acquisition of said MR scan and storage of said MR scan template multiple times, thereby obtaining a plurality of scan templates in said memory;
determine one of said MR scan templates in said memory by receiving an input that designates properties of an MR scan to be performed, and determine the MR scan template as a function of said properties; and
operate the MR apparatus to execute an imaging sequences according to the determined MR scan template in order to acquire MR data, and make the acquired MR data available from the processor as a data file.

* * * * *